United States Patent [19]

Ku et al.

[11] Patent Number: 5,384,720
[45] Date of Patent: Jan. 24, 1995

[54] LOGIC CIRCUIT SIMULATOR AND LOGIC SIMULATION METHOD HAVING REDUCED NUMBER OF SIMULATION EVENTS

[75] Inventors: Tsu-Wei Ku, San Jose; Wei-Kong Chia, Sunnyvale; Dong-Ru Shieh, Cupertino, all of Calif.

[73] Assignee: Hitachi Micro Systems Inc., San Jose, Calif.

[21] Appl. No.: 74,927

[22] Filed: Jun. 10, 1993

[51] Int. Cl.[6] .............................................. G06F 15/20
[52] U.S. Cl. ..................................... 364/578; 364/488
[58] Field of Search ........ 395/500; 364/578, 488–491; 371/23, 27

[56] References Cited

U.S. PATENT DOCUMENTS

| 4,982,361 | 1/1991 | Miyaoka et al. | |
|---|---|---|---|
| 5,051,941 | 9/1991 | Takamine et al. | 364/578 |
| 5,062,067 | 10/1991 | Schaefer et al. | 364/548 |

OTHER PUBLICATIONS

Dunne et al. "An Algorithm for Optimising Signal Selection in a Demand-Drive Digital Circuit Simulation" Dec. 91 pp. 269-280.
Smith, S. P. "Demand Driven Simulation" *Progress in Computer Aided VLSI Design*, 1989, pp. 191-233.
Subramanian, K. et al "Distributed & Parallel Demand Drives Logic Simulation" 1990 pp. 485-490.
"Demand Driven Simulation: BACKSIM"; Steven P. Smith et al.; 24th ACM/IEEE Design Automation Conference; 1987; pp. 181-187.
"Exploitation of Periodicity in Logic Simulation of Synchronous Circuits"; Rahul Razdan et al.; IEEE 1990, CH2924-9/90/0000/0062; pp. 62-65.

*Primary Examiner*—Parshotam S. Lall
*Assistant Examiner*—Brian Ledell
*Attorney, Agent, or Firm*—Flehr, Hohbach, Test, Albritton & Herbert

[57] ABSTRACT

A logic simulation system and method reduces the number of events to be simulated. The simulator receives a user specified circuit netlist denoting a specified logic circuit's components and the nodes interconnecting those components. A user specified watched nodes list identifies the circuit nodes for which output waveforms are to be generated. A cell library provides cell delay data representing signal delays from each input port to each output port of each circuit component. A set of input signal waveforms are compiled into a sequence of variable length time periods and each input signal is assigned an extended boolean value for each time period. The extended boolean values identify signals that are stable over the time period, signals with a single transition during the time period, and signals with multiple transitions during the time period. For each time period, operation of the logic circuit is initially simulated without determining when signal transitions on the circuit's nodes occur, by performing an extended zero delay simulation. The extended zero delay simulation assigns to each circuit node an extended boolean signal value selected from the set consisting of stable signal values (0, 1, X and Z), signal values (t0, t1, tX, tZ) having a single transition during the time period, and a signal value (mt) indicating more than one transition during the time period. For each time period, the circuit is backtracked from those watched nodes assigned non-stable values so as to identify nodes that control those watched nodes and that were assigned non-stable values. Then event driven simulation of the logic circuit is performed for events on those identified nodes.

12 Claims, 6 Drawing Sheets

|    | 0 | 1  | X | Z  | t0 | t1 | tX | tZ | mt |
|----|---|----|---|----|----|----|----|----|----|
| 0  | 0 | 0  | 0 | 0  | 0  | 0  | 0  | 0  | 0  |
| 1  | 0 | 1  | X | Z  | t0 | t1 | tX | tZ | mt |
| X  | 0 | X  | X | X  | X  | X  | X  | X  | X  |
| Z  | 0 | Z  | X | X  | t0 | tX | tX | tX | mt |
| t0 | 0 | t0 | X | t0 | t0 | mt | mt | mt | mt |
| t1 | 0 | t1 | X | tX | mt | t1 | mt | mt | mt |
| tX | 0 | tX | X | tX | mt | mt | mt | mt | mt |
| tZ | 0 | tZ | X | tX | mt | mt | mt | mt | mt |
| mt | 0 | mt | X | mt | mt | mt | mt | mt | mt |

FIGURE 5A

|    | 0  | 1 | X | Z | t0 | t1 | tX | tZ | mt |
|----|----|---|---|---|----|----|----|----|----|
| 0  | 0  | 1 | X | Z | t0 | t1 | tX | tZ | mt |
| 1  | 0  | 1 | 1 | 1 | 1  | 1  | 1  | 1  | 1  |
| X  | X  | 1 | X | X | X  | X  | X  | X  | X  |
| Z  | Z  | 1 | X | X | tX | t1 | tX | tX | mt |
| t0 | t0 | 1 | X | tX | t0 | mt | mt | mt | mt |
| t1 | t1 | 1 | X | t1 | mt | t1 | mt | mt | mt |
| tX | tX | 1 | X | tX | mt | mt | mt | mt | mt |
| tZ | tZ | 1 | X | tX | mt | mt | mt | mt | mt |
| mt | mt | 1 | X | mt | mt | mt | mt | mt | mt |

FIGURE 5B

| Input | Output |
|-------|--------|
| 0     | 1      |
| 1     | 0      |
| X     | X      |
| Z     | X      |
| t0    | t1     |
| t1    | t0     |
| tX    | tX     |
| tZ    | tX     |
| mt    | mt     |

LOGIC CIRCUIT SIMULATOR AND LOGIC SIMULATION METHOD HAVING REDUCED NUMBER OF SIMULATION EVENTS

The present invention relates generally to computer aided design systems which facilitate the design of integrated circuits and particularly to computer aided design methods and systems for reducing the amount of computer resources used while simulating very large, complex logic circuit designs.

BACKGROUND OF THE INVENTION

Virtually all complex integrated circuits are designed with the use of computer aided design (CAD) tools. Some CAD tools, called simulators, help the circuit designer verify the operation of a proposed circuit. Logic simulators are CAD tools for circuits that generate binary signals, which either have a value of 0 or 1. Logic simulation is generally much faster and requires much less computer resources than analog circuit simulation because output values for each circuit element are generated by table look-up rather than by computing complex equations.

However, logic simulation has progressively become more complex because of the necessity of taking into account (A) signal delays, (B) signals that are "in transition", and (C) signals having an unknown binary value, such as data values in a datapath circuit, as opposed to the control signals. Furthermore, some large application specific integrated circuits (ASICs) contain so many logic gates that even the most efficient logic simulators require inordinate amounts of computer time or the use of extremely expensive computers in order to perform such simulations in a reasonable amount of time. ASICs being designed at the time of this application can have hundreds of thousands of logic gates, and there will most likely be demand for ASICs with millions of logic gates in the not very distant future.

Current logic simulators do not handle the simulation of such large circuits efficiently. In particular, it has been determined by the inventors of the present invention that most of the computations performed by logic simulators on large circuit simulations are wasted on "useless events" that do not affect the output nodes of the circuit. That is, many signal transitions in such large circuits affect neither (A) the internal stored state of the circuit nor (B) the outputs of the circuit. The prior art event driven logic simulators, however, must simulate all signal transitions because the prior art logic simulators do not have any mechanism for predicting which signal transitions are "useless" and which are "important".

The present invention provides a comprehensive and very simple method of determining which signal transitions have to be simulated and which can be simply ignored. Particularly in large logic circuits having in excess of 1000 logic gates, the present invention has been shown to reduce the number of simulated events by factors ranging from as little as 10 percent to more than 98 percent.

Netlists

The detailed circuit specification used by circuit simulators and other circuit design and analysis tools is often called a netlist, and comprises a list of circuit components and the interconnections between those components. Circuit components are also known as "cells" where each cell in a specific circuit library has both a logical representation, as well as a circuit layout representation. A short netlist for a simple circuit is shown in Table 1.

TABLE 1

| Cell Name | Exemplary Netlist | | | |
|---|---|---|---|---|
| | Input Signals | | Output Signals | |
| | 1 | 2 | 1 | 2 |
| XOR | A | B | C | |
| XOR | C | CN1 | Y | |
| AND | A | B | CA | |
| AND | C | CN1 | CB | |
| NOR | CB | CA | CN | |

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably.

In the exemplary netlist shown in Table 1, signals A, B and CN1 are input nodes to the entire circuit, Y and CN are output nodes for the entire circuit, and nodes C, CA and CB are internal nodes.

In addition, the netlist specifies the nature of its components by specifying a cell name for each component. The cell name, in turn, specifies or points to a particular circuit in a predefined library of cells.

SUMMARY OF THE INVENTION

In summary, the present invention is a logic simulation system and method that reduces the number of events to be simulated. The logic simulation system receives a user specified circuit netlist denoting a specified logic circuit's components and the nodes interconnecting those components. A user specified "watched nodes list" identifies the circuit nodes for which output waveforms are to be generated. A cell library provides cell delay data representing signal delays associated with the components of the logic circuit, where the delay data for each component represents signal delays from each input port to each output port of the component.

A set of input signal waveforms are compiled into a sequence of variable length time periods. Each input signal is assigned an "extended boolean" value for each time period. The extended boolean values identify signals that are stable over the time period, signals with a single transition during the time period, and signals with multiple transitions during the time period.

For each time period, operation of the logic circuit is initially simulated without determining when signal transitions on the circuit's nodes occur, by performing an extended zero delay simulation for each time period. The extended zero delay simulation assigns to each circuit node an extended boolean signal value selected from the set consisting of stable signal values (0, 1, X and Z), signal values (t0, t1, tX, tZ) having a single transition during the time period, and a signal value (mt) indicating more than one transition during the time period. For each time period, the circuit is backtracked from those watched nodes assigned non-stable values so as to identify nodes that control those watched nodes and that were assigned non-stable values. Then event driven simulation of the logic circuit is performed for events on those identified nodes.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
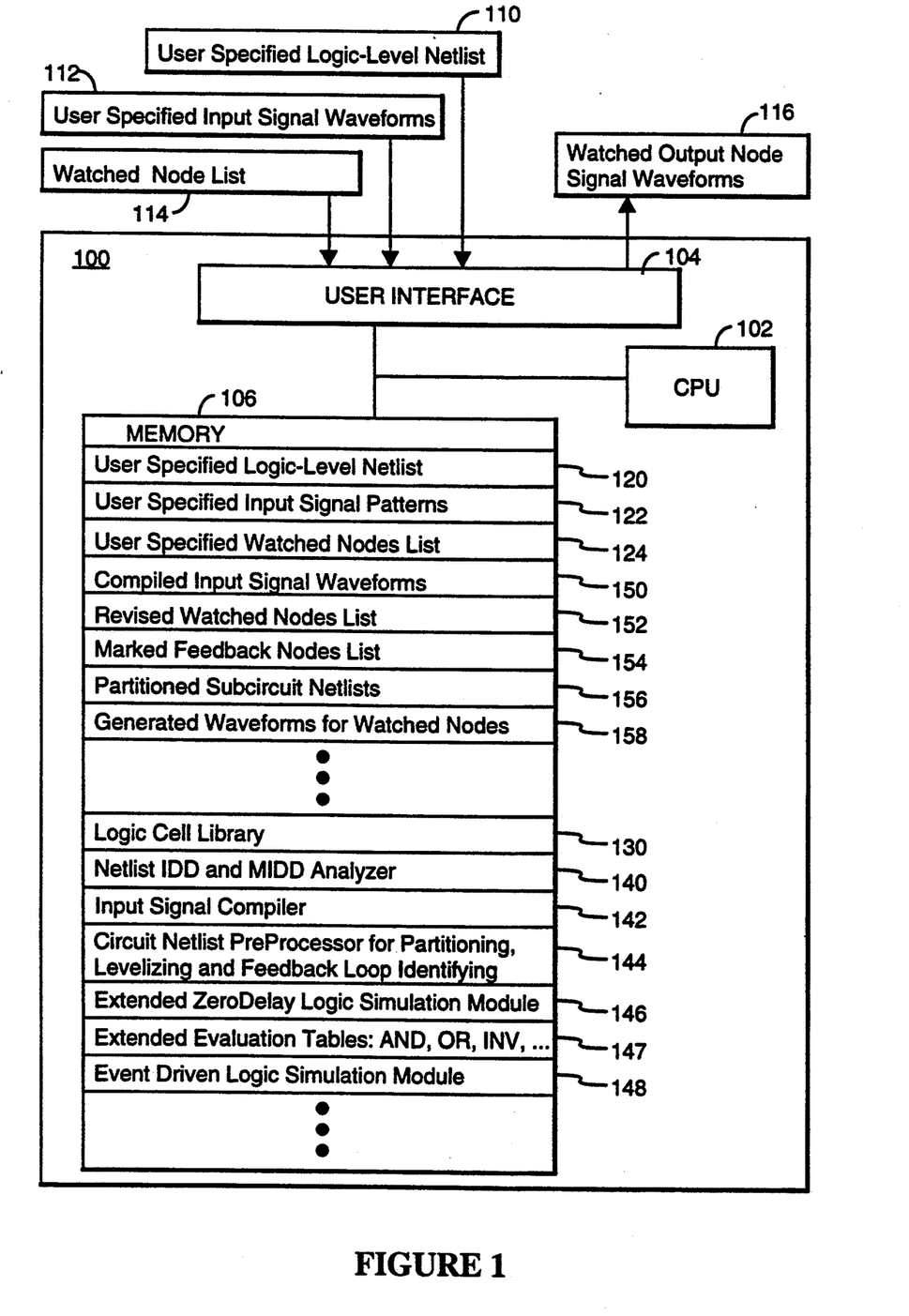
FIG. 1 is a conceptual block diagram of a computer aided circuit design system in accordance with the present invention.

Referring to FIG. 1, the computer aided circuit design (CAD) system 100 of the present invention includes a central processing unit (CPU) 102 such as the Sparc processor made by Sun Microsystems, Inc., a user interface 104 for communicating with the user or users of the system, and computer memory 106. Computer memory 106 typically includes both high speed random access memory and non-volatile disk storage memory. The exact mix of memory components is not important to the present invention, and many different CPU's could also be used, although the memory and central processor components used will affect the speed of operation of the logic simulator operations of the present invention.

Inputs to the system 100 include a user specified circuit netlist 110, a user specified set of input signal waveforms 112 and a watched nodes list 114. The specified input signal waveforms 112 drive corresponding input nodes of the specified circuit netlist. The input signal waveforms 112 may include specially identified clock signals and control signals, which are treated differently than other input signals by the circuit simulation method of the present invention. The watched nodes list 114 identifies the nodes for which the user wants to receive computed signal waveforms 116.

Figure 2:
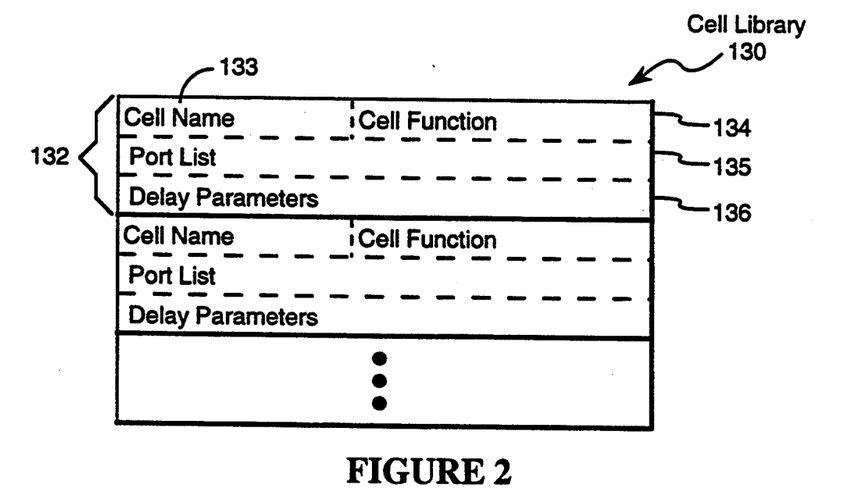
FIG. 2 is a block diagram of a cell library.

The user specified inputs 110, 112, and 114 are stored in arrays 120, 122 and 124 in computer memory 106. Also stored in memory 106 is a cell library 130. As shown in FIG. 2, each gate or cell 132 in the cell library 130 is typically characterized by a cell name 133, its boolean or logical function 134, a port list 135 and timing or delay parameters 136. The functional information in the cell library 130 is typically specified in terms of a boolean equation, as well as a specification of the number of input signals, output signals, power connections, and so on. The timing information 136 in the cell library for a particular cell represents the timing delay from each input put to each output pin. The timing information can be as simple as a fixed delay value for each input pin of a cell, or can be in the form of equation parameters for signal rise and fall times based on the fanout of each instance of the cell. In either case, for a given circuit netlist, the delay time associated with each input pin of each logic gate can be generated by retrieving the appropriate information from the cell library 130.

Memory 106 is also used for storing software modules 140, 142, 144, 146, 147, and 148, and for storing arrays 150, 152, 154, 156, and 158 of generated data.

Figure 3A:
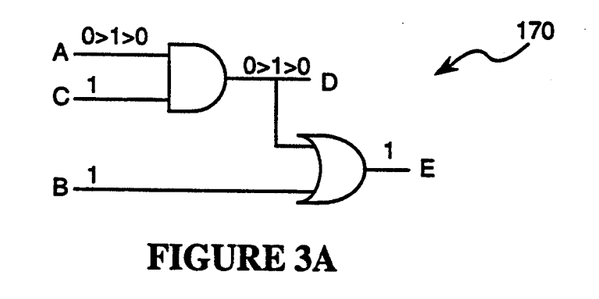
FIGS. 3A and 3B represent a simple logic circuit and a timing diagram for that logic circuit, respectively.
Figure 3B:
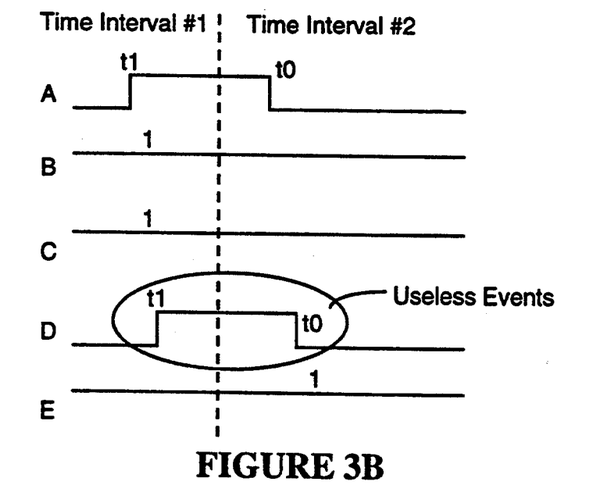

Referring to FIG. 3A, there is shown an example of the "useless events" that waste much of the computation time used by conventional event driven logic simulators. In particular, the circuit 170 shown in FIG. 3 includes an AND gate having input ports coupled to nodes A and C and an output port coupled to node D, and an OR gate having input ports coupled to nodes B and D and an output port coupled to node E. FIG. 3B is a timing diagram for the circuit 170 shown in FIG. 3A. As shown, the up and down signal transitions on node D have no effect on output node E. While a human engineer would recognize that whenever node B has a signal value of 1, the signal value on node D is irrelevant, it has been difficult to include this type of analytical thinking in event driven logic simulators.

Extended Zero Delay Simulation and Extended Boolean Signal Representation

The present invention does not identify useless signal transitions, but rather identifies those signal transitions that need to be simulated in order to determine the timing of the circuit's watched nodes. To accomplish this, the simulation process begins by dividing the simulation time period into a sequence of distinct, but variable length time intervals. Then, for each such time interval the specified logic circuit is initially simulated based on an "extended" version of "zero delay" simulation. In other words, during this initial simulation step the gates of the logic circuit are treated as though there is zero delay from input port to output port.

Figure 4:
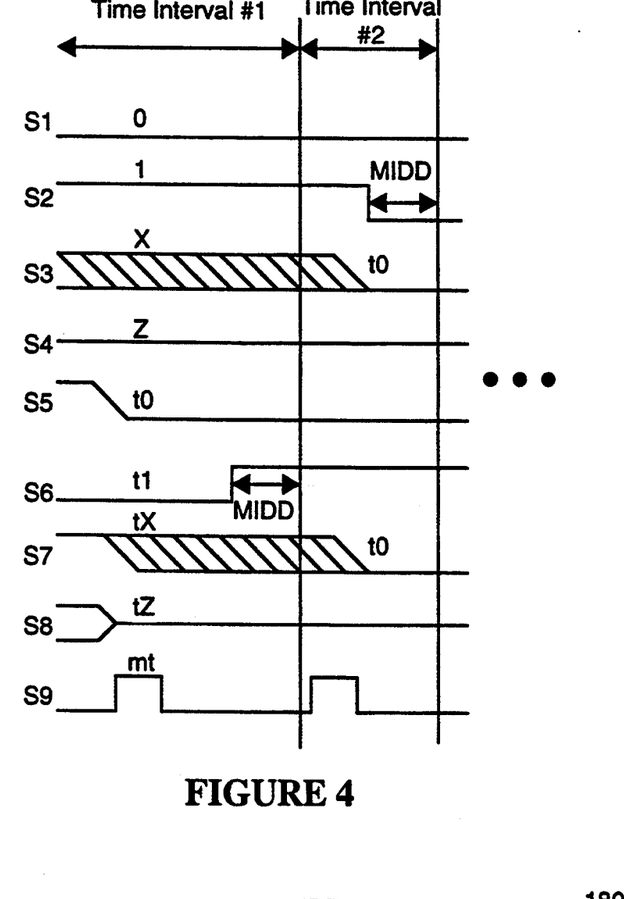
FIG. 4 depicts timing diagrams for nine exemplary signals.

Referring to FIG. 4, to make this type of "zero delay" simulation produce a meaningful result, the set of signal states used to represent the signals on each node of the circuit are extended as follows. FIG. 4 shows nine different signals S1 to S9. Instead of assigning each signal a boolean signal value (e.g., 0, 1, X or Z) at each instant in time, a single "extended boolean" signal representation is assigned to each signal for each entire time interval. Note that a signal value of "X" is herein used to mean that the signal value is "unknown", as may be the case for a data signal being processed by the circuit. A signal value of "Z" is herein used to mean the signal value on an isolated, high impedance node.

In the preferred embodiment, each signal in the specified circuit is assigned one of nine signal values for the entire duration of each identified time interval. Static signals such as S1, S2, S3 and S4 are assigned their standard boolean signal values, 0, 1, X and Z, respectively. Signals that have a single transition during the time interval, as represented by signals S5, S6, S7 and S8 are assigned a signal value that starts with a "t" (for transition) followed by a character that identifies the signal's value at the end of the time interval. Signals S5, S6, S7 and S8 are assigned signal values of t0, t1, tX and tZ for the first time interval shown in FIG. 4. The signal value t0 is assigned to any signal that transitions to 0 from 1, X or Z during the identified time interval. Similarly, the signal value t1 is assigned to any signal that transitions to 1 from 0, X or Z during the identified time interval; the signal value tX is assigned to any signal that transitions to X from 0, 1, or Z during the identified time interval; and the signal value tZ is assigned to any signal that transitions to Z from 0, 1, or X during the identified time interval.

Finally, any signal having more than one transition during an identified time period is assigned a value of "mt", which stands for "multiple transitions".

Figure 5A:
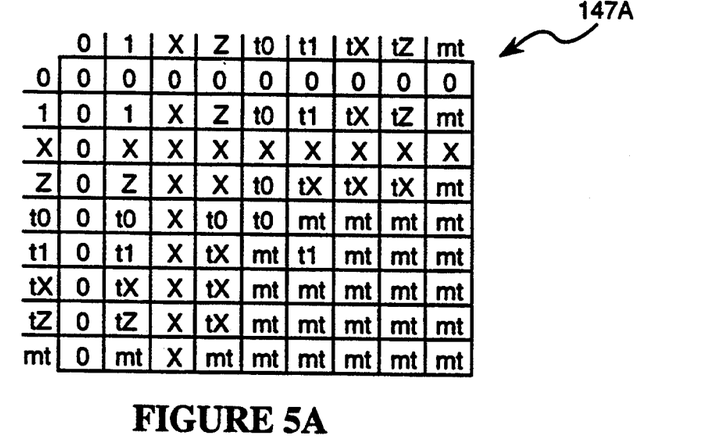
FIGS. 5A, 5B and 5C are extended logic evaluation tables for a two input AND gate, and two input OR gate and an invertor, respectively.
Figure 5B:
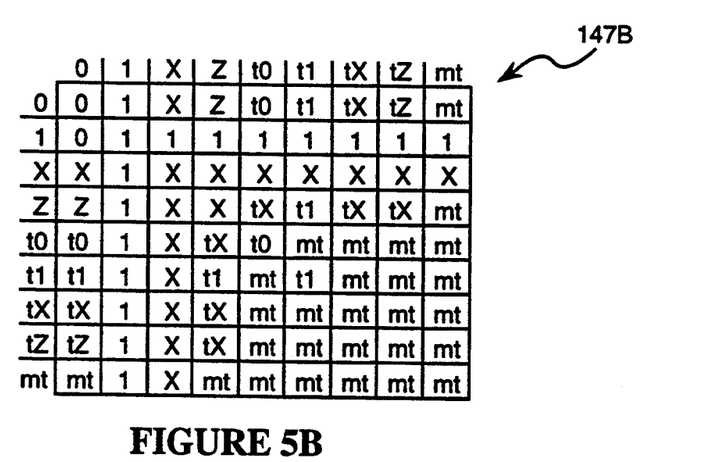
Figure 5C:
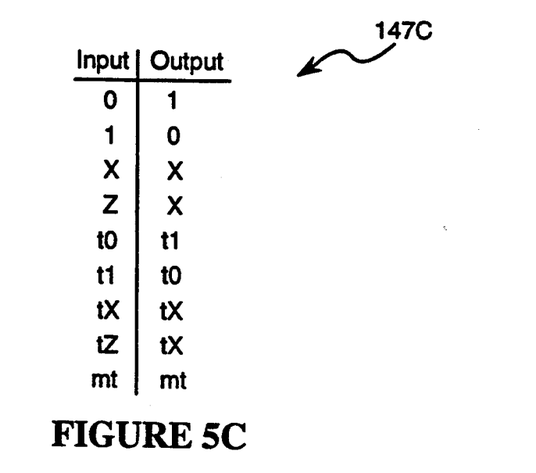

Referring to FIGS. 1, 5A, 5B and 5C, in order to efficiently perform extended zero delay simulation of a circuit, "extended" evaluation tables 147 need to be generated for every logic gate in the cell library 130. FIG. 5A shows the extended evaluation table 147A for a two input AND gate, FIG. 5B shows the extended evaluation table 147B for a two input OR gate, and FIG. 5C shows the extended evaluation table 147C for an invertor.

For instance, in conjunction with the circuit 170 shown in FIG. 3A, it can be seen that input signals A, B and C would be represented as t1, 1 and 1 for time interval #1, respectively. Using table 147A in FIG. 5A to evaluate the signal D produced by the circuit's AND gate from input signals equal to t1 and 1, produces a value of t1 for signal D. Using table 147B in FIG. 5B to evaluate signal E produced by the circuit's OR gate from input signals equal to t1 and 1, produces a value of 1 for signal E.

From the three extended evaluation tables in FIGS. 5A–5C anyone skilled in the art of logic simulation programming techniques will be able to automatically generate the evaluation tables for more complicated logic cells.

Determining Variable Size Time Intervals for Extended Zero Delay Simulation

A pseudocode representation of the process for compiling input signal waveforms into a compact form is shown in Table 2. Tables 2 and 3 contain pseudocode representations of the software routines relevant to the present invention. The pseudocode used in these appendices is, essentially, a computer language using universal computer language conventions. While the pseudocode employed here has been invented solely for the purposes of this description, it is designed to be easily understandable by any computer programmer skilled in the art.

Figure 6:
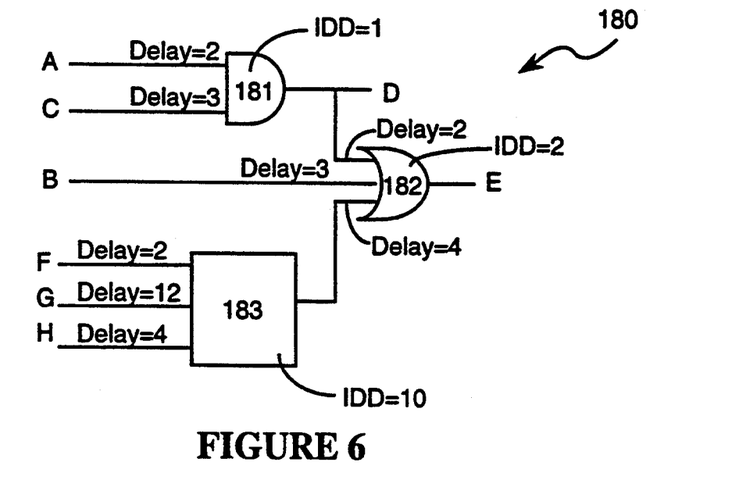
FIG. 6 represents a simple logic circuit.

Prior to compiling the user specified input signal waveforms into discrete time intervals, the user specified circuit is analyzed to identify the largest timing skew introduced by the circuit's gates. In particular, for each gate of the circuit having at least two inputs, the input delay parameters are retrieved from the cell library and the difference between the largest and smallest delay of all inputs to the gate is computed. The resulting value is called the input delay difference (IDD) of the gate. Referring to the logic circuit 180 in FIG. 6, the gates 181, 182, 183 of the circuit have IDD values of 1, 2 and 10, respectively. The maximum input delay difference (MIDD) for all the gates in the circuit is computed and used in the process of compiling the user specified input signal waveforms.

Once the MIDD value of a specified circuit has been determined, the user specified input signal waveforms are divided into a sequence of variable length time intervals. Each time interval includes at least one signal transition on at least one input signal. The end of each time interval is found by "sliding a window of width MIDD" over the input signal waveforms until a period of MIDD is found in which all input signals are stable. For the purposes of the input signal waveform compilation process, if any input clock signals have a maximum time between signal transitions that is less than MIDD (usually all clock signals will be slower than MIDD), those clock signals are labelled "mt" for all time intervals and are excluded from the set of input signals being compiled. All other clock signals are compiled with other input signals.

Once the input signal waveforms have been divided into a sequence of time intervals, each input signal is assigned a single "extended boolean" value (i.e., one of the nine values: 0, 1, X, Z t0, t1, tX, tZ, or mt) for each time interval. The resulting input signal values, herein called the compiled input signal waveforms, are stored in memory 106 in array 150. As will be discussed below, these compiled input signal waveforms are suitable for extended zero delay simulation of the specified logic circuit.

Extended Zero Delay Simulation

Extended zero delay simulation is performed simply by evaluating each logic gate in the circuit using the extended evaluation tables 147. As a result, each node of the circuit is assigned a single extended boolean value for each distinct time interval.

Circuit Netlist Preprocessing Prior to Simulation

Figure 7:
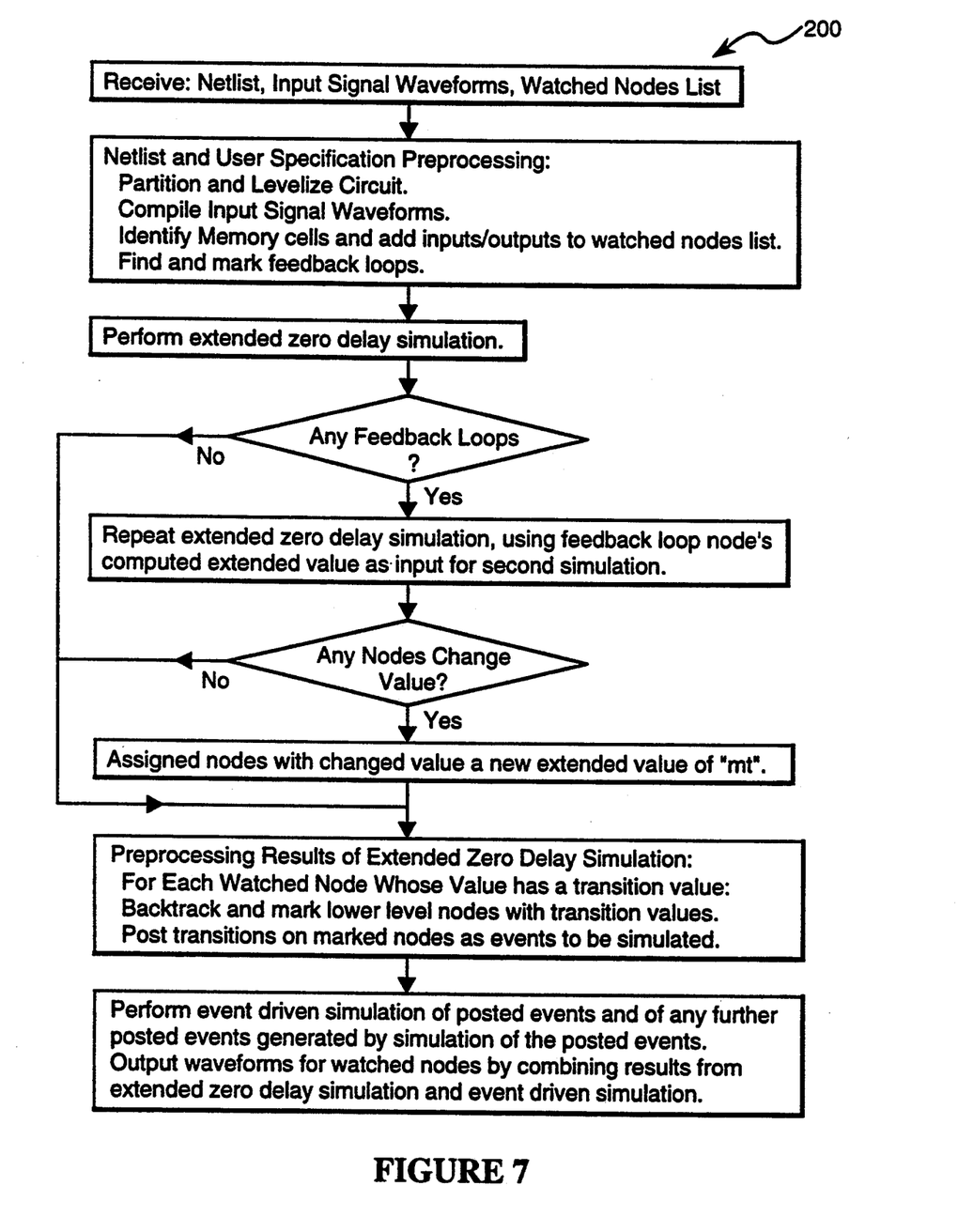
FIG. 7 is a flow chart of the logic simulation process of the present invention.

Referring to the flowchart in FIG. 7, as well as the pseudocode representation of the logic simulation process of the present invention in Table 3, the user specified netlist, input signal waveforms and watched nodes list are preprocessed in a number of ways prior to simulation of the specified logic circuit.

The number of computations required for extended zero delay simulation is reduced by levelizing the logic circuit prior to performing the extended zero delay simulation, and then performing the evaluations of the cells in levelized order.

It is well known to those skilled in the art the number of evaluations required for logic simulations is minimized or close to minimized when the circuit is evaluated in levelized order.

Optionally, the specified netlist can be partitioned into subnetlists in accordance with the clock signals and control signals used by different portions of the specified circuit. Clock signals are identified during the input signal waveform compilation process as those input signals connected to the clock or trigger ports of latches, and control signals are identified as those input signal connected to the enable/disable ports of signal buffers and tri-state gates. A circuit can be partitioned if at least one part of the circuit is completely separated from all other parts of the circuit by clocked latches. When such a partition is identified, the latches that provide the inputs to the partition are considered to be part of that partition. The timing of the output signals from such latches (i.e., the latched inputs to the partition) is important, and thus those signals are typically assigned the extended boolean value mt or tX. If the latch's clock has multiple clock cycles during a zero delay simulation period, the latch's outputs are assigned the extended boolean value mt, and if the latch's clock has one clock cycle during a zero delay simulation period, the latch's outputs are assigned the extended boolean value tX.

The above described input signal waveform compilation process is part of the preprocessing of the user specification of the logic simulation to be performed. When the specified circuit has been partitioned, the input signal waveforms are separately compiled for each circuit partition.

The input and output nodes of memory cells in the specified logic circuit are added to the user specified watched node list, or to a copy thereof (see array 152 in FIG. 1). Memory cells generally latch in data values based on clock signal transitions. Furthermore, the data values stored in memory cells represent the stored state of the specified circuit, and proper simulation of the specified logic circuit requires storing the proper values in those memory cells, even if the memory cell's input or output nodes are not on the user specified watched nodes list. Adding these nodes to the watched nodes list ensures that the logic simulation process does not ignore any events that change the data stored in the circuit's memory cells.

Figure 8:
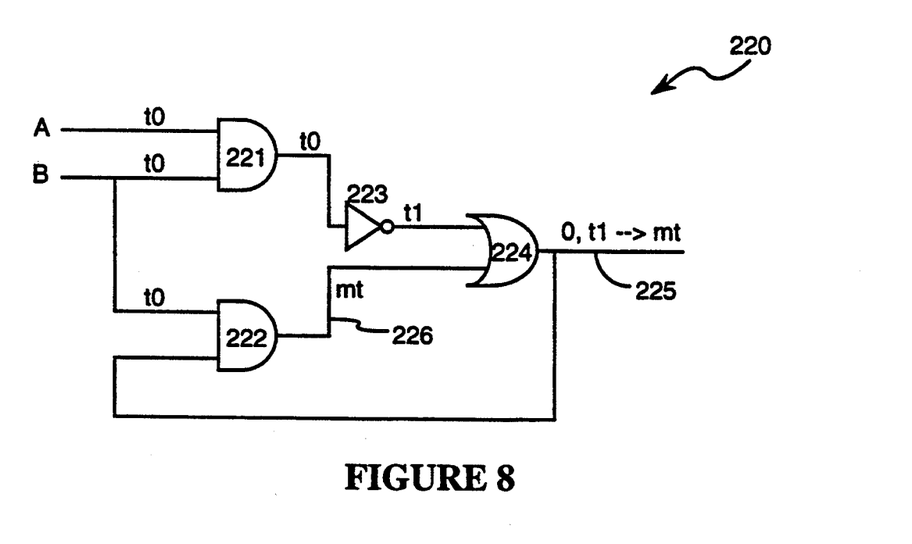
FIG. 8 represents a simple logic circuit with a feedback loop.

The last preprocessing step in the preferred embodiment is identifying feedback loops in the specified logic circuit. Feedback loops can cause signal glitches and other types of asynchronous signal transitions. For example, referring to FIG. 8, circuit 220 has four logic gates 221–224. Based on the input signal waveforms shown in FIG. 8, the output node 225 of the circuit will have a value of 0 at the beginning of the simulation period, but will transition to a value of 1. As a result, one input to gate 222 will transition to 0 while the other input to gate 222 will transition to 1 during the evaluation period. Thus the signal waveform on node 226 will depend on input signal delays of gate 222 and the relative timing of the gate 222's input signal transitions.

To identify when feedback loops, as well as bi-directional signal lines, cause multiple signal transitions whose timing is important to the specified circuit's operation, all feedback nodes are marked for special evaluation during the logic simulation process. As shown in FIG. 1, a list of the marked feedback nodes is stored as an array 154 in memory 106.

Circuit Simulation Process

Referring to FIG. 7 and Table 3, after preprocessing of the user specified netlist, input signal waveforms and watched nodes list, an initial extended zero delay simulation of the circuit is performed for each of the identified time intervals using the compiled input signal waveforms. In this initial simulation, the signal value used for each feedback node is the initial signal value on each such node for the time interval being simulated. If the circuit does include at least one feedback loop, then a second extended zero delay simulation of the circuit is performed for each of the identified time intervals using (A) the compiled input signal waveforms, and (B) the computed feedback node values as the input for gates having input ports coupled to each feedback node.

The results of the two extended zero delay simulations are compared, and any nodes whose computed signal value is changed in the second simulation from the first simulation is assigned a signal value of "mt".

At this point, the simulation process is complete for all watched nodes that have computed static signal values. In other words, if watched node N1 has a static value during time interval #X, no further simulation of node N1 during time interval #X is undertaken. Next, a dynamically determined number of events are simulated using convention event driven simulation techniques.

To determine what additional simulation computations need to be performed, the results of the extended zero delay simulation are analyzed to locate any watched nodes having non-static computed values. From each such non-static node, the logic circuit is backtracked and all lowed level nodes with non-static computed values are marked, and the transitions on those nodes are posted as events to be simulated. Note that each branch of the backtracking process is terminated whenever a node with a static signal value is encountered. Thus, the "cone" of marked nodes extending towards the inputs of the circuit is typically truncated in many places, which reduces the number of events to be simulated.

Then, using a conventional event driven logic simulation module 148, the posted events are simulated so as to determine the timing of the identified signal transitions on the watched nodes. The watched node waveforms computed by the even driven logic simulation module are combined with the static waveforms computed by the extended zero delay logic evaluation module to produce a full set of generated signal waveforms (stored in array 158 of memory 106). Note that the waveforms for some circuit nodes computed by the convention event driven simulation may extend beyond the end of the zero delay time period for the current simulation step, due to circuit delays. When this happens, the extended boolean value assigned to such nodes for the affected zero delay simulation periods (which have not yet been simulated) is modified accordingly, and those modified extended boolean values are used during subsequent zero delay simulation periods.

When the circuit to be simulated is partitioned, as is typically the case for very large circuits, the simulation process is somewhat more complicated. In particular, the input signals for each partition are separately compiled, which will typically result in different sets of zero delay simulation periods for each partition. During simulation, each partition is simulated separately for one zero delay simulation period. Then, another partition is selected and simulated separately for one zero delay simulation period. This process is continued until all partitions have been simulated for all time periods. The process for determining the order in which to simulate each "partition-time period" is based on (A) partition dependencies, meaning that partitions that generated input signals for other partitions should be simulated first whenever possible, and (B) the earliest simulation period for all partitions that has not yet been simulated.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE 2

| Pseudocode For Input Signal Waveform Compilation |
| --- |
| Receive Netlist of Specified Circuit |
| Scan Cell Library to obtain IDD value for all logic gates in Specified Circuit |
| Set MIDD = the largest IDD value for all logic gates in the Specified Circuit |
| Receive Input Signal Waveforms |
| StartTime = Earliest Time for which any input signal is assigned a value |
| EndTime = Last Time for which any input signal has a transition in value |

TABLE 2-continued

Pseudocode For Input Signal Waveform Compilation

```
T = StartTime
If Circuit Has Been Partitioned (see Table 3) {
    Exclude from Relevant Input Signals those input signals not used by the
    partition whose input signals are currently being compiled.
}
For all Relevant Input Signals, DO While T < EndTime {
    T1 = First Input Signal Transition at or after time T
    Set T2 equal to the smallest time value that
        (A) is greater than or equal to T1 + MIDD; and
        (B) for which there are no input signal transitions in the time period
            TQ defined as: T2 − MIDD ≦ TQ < T2
    Output time period (T,T2) as a zero delay simulation period.
    − Assign Compiled Values to all Input Signals
    For All Input Signals IS$_i$
        {
        If IS$_i$ has no signal transitions during the time period [T,T2] {
            Set ISi value to 1, 0, Z or X in accordance with its value in the
            Received Input Signal Waveforms. }
        ElseIf IS$_i$ has exactly one signal transition during time period [T,T2] {
            Set ISi value to t1, t0, tZ or tX in accordance with its value >>
            just before time T2 in the Received Input Signal Waveforms.
            }
        Else Set IS$_i$ value to mt.
        }
    Store Compiled Input Signal Values for the current zero delay period.
    Set T = T2
    }
```

TABLE 3

Pseudocode For Logic Simulation Process

```
Receive Netlist of Specified Circuit
Receive Input Signal Waveforms
Partition the Specified Circuit According to Clock and Control Signals
Levelize each Circuit Partition
For Each Circuit Partition {
    Compile Input Signal Waveforms (see Table 2)
    }
DO Until {All Partitions have been simulated for all zero delay simulation periods}
    Select Next Partition to Simulate Based on Partition Dependencies and
    Earliest Simulation Period not yet simulated.
    Re-Compile Input Waveforms for the Selected Partition if a Latched Input
    to the Partition has a stable value for the next zero delay simulation period
    to be simulated.
    Receive List of Watched Nodes for Selected Partition
    Add to list of watched nodes: data input and output nodes of all memory
    cells.
    Find all feedback loops in circuit partition, break feedback loops and mark
    feedback nodes.
    Simulate Circuit Partition Using Extended Zero Delay Simulation
    If Circuit Partition has at least one feedback node {
        Re-Simulate Circuit Partition, using zero delay simulation, and using
        feedback signal values.
        Re-evaluate all nodes whose value is different from the prior zero
        delay simulation.
        }
    − Dynamic Demand Event Driven Simulation:
    For each watched node whose value has a transition {
        Backtrack to Find and Lower Level Nodes that (A) affect the watched
        node and (B) have a value that transitions during the zero delay
        simulation period.
        Post as simulation events the signal transitions of the marked lower
        level nodes.
        }
    Perform event driven simulation of the posted events and of any further
    posted events generated by the simulation of the posted events.
    }
}
Output generated waveforms for watched nodes.
− End of Pseudocode For Logic Simulation Process
```

What is claimed is:

1. A method of simulating the operation of an electronic logic circuit having a multiplicity of logic gates, said method comprising the steps of:

(A) receiving and storing in a computer memory a netlist denoting said logic circuit's components and nodes interconnecting said components; each said component of said logic circuit having at least one input port and at least one output port, said nodes including circuit input nodes and circuit output nodes for said logic circuit;

(B) receiving cell delay data representing signal delays associated with said components in said logic circuit; said delay data for each component representing signal delays from each input port to each output port of said component;

(C) receiving and storing in said computer memory input signal waveforms for input signals applied to said circuit input nodes;

(D) parsing said input signal waveforms into a sequence of variable length time periods in accordance with predefined criteria;

(E) identifying a set of said logic circuit's nodes as watched nodes;

(F) for each said time period, initially simulating operation of said logic circuit without determining when signal transitions on said circuit's nodes occur, said initial simulation step including assigning each signal on each node in said logic circuit an extended boolean value selected from the set consisting of stable signal values (0, 1, x and z), and non-stable signal values, said non-stable signal values including signal values (t0, t1, tx, tz) having a single transition during said time period, and a multiple transition signal value (mt) indicating more than one transition during said time period; said initial simulation stem including evaluating outputs of said logic circuit's components using predefined extended boolean truth tables wherein for each of at least a plurality of said predefined extended boolean truth tables, said each predefined extended logic table specifies at least stable output, having one of said stable signal values, corresponding to a set of input signals that include at least one input signal having one of said non-stable signal values and at least one input signal having one of said stable signal values; and (G) for each said time period, backtracking through said logic circuit for each respective watched node assigned a non-stable value so as to identify nodes that control said respective watched node and that were assigned non-stable signal values, and then performing event driven simulation of said logic circuit for signal transition events on said identified nodes;

said steps F and G generating simulated waveforms representing signal values on said watched nodes over a defined period of time.

2. The circuit simulation method of claim 1, said steps A–G further including levelizing said logic circuit, and identifying all feedback loop nodes, if any, in said logic circuit;

said initial simulation step including evaluating each feedback loop node in accordance with predefined criteria to identify those of said feedback loop nodes whose signal value during a specified time period may be changed by propagation of signals through a feedback loop, and assigning said identified feedback loop nodes said multiple transition signal value for said specified time period;

said performing event driven simulation step including simulation of signal transitions on said feedback loop nodes and signal transitions on other nodes caused thereby.

3. The circuit simulation method of claim 1, said steps (A–G) further including levelizing said logic circuit, and identifying all feedback loop nodes, if any, in said logic circuit;

said initial simulation step including, when said logic circuit includes at least one identified feedback loop node, performing, for each said time period, a first evaluation of signal values on said logic circuit's nodes in which component input ports coupled to respective ones of said feedback loop nodes are assigned an initial signal value for said time period, to generate first commuted extended logic signal values for said logic circuit's nodes;

performing for each said time period, a second evaluation of said signal values on said logic circuit's nodes in which component input ports coupled to respective ones of said feedback loop nodes are assigned said said first commuted extended logic signal values for said feedback loop nodes, to generate second commuted extended logic signal values for said logic circuit's nodes; and for each said time period, assigning said multiple transition signal value to any node of said logic circuit whose second computed extended logic signal value assigned by said second evaluation differs from the first commuter extended logic signal value assigned during said first evaluation; and said performing event driven simulation step including simulation of signal transitions on said feedback loop nodes and signal transitions on other nodes caused thereby;

whereby signal transitions on any of said watched nodes in said logic circuit that result from signal transitions on said feedback loop nodes are properly simulated.

4. The circuit simulation method of claim 1, further including:

partitioning said logic circuit into a plurality of circuit partitions in accordance with predefined criteria;

for each respective circuit partition, separately performing said parsing step D for those of said input signals utilized by each respective circuit partition, wherein said sequence time periods for said each respective circuit partition may be different from said sequence of time periods for other ones of said circuit partitions; and repeatedly performing the steps of: selecting a circuit partition to simulate for one time period, and performing said steps F and G on said selected circuit partition for a next one of the selected circuit partition's sequence of time periods.

5. A method of simulating the operation of an electronic logic circuit having a multiplicity of logic gates, said method comprising the steps of:

(A) receiving and storing in a computer memory a netlist denoting said logic circuit's components and nodes interconnecting said components; each said component of said logic circuit having at least one input port and at least one output port, said nodes including circuit input nodes and circuit output nodes for said logic circuit;

(B) receiving cell delay data representing signal delays associated with said components in said logic circuit; said delay data for each component representing signal delays from each input port to each output port of said component;

(C) for each of said components having at least two input ports, determining an input delay differential (IDD) corresponding to the maximum difference between signal delays for each said component, and determining a maximum input delay differential (MIDD) corresponding to the maximum IDD for said components in said logic circuit;

(D) receiving and storing in said computer memory input signal waveforms for input signals applied to said circuit input nodes;

(E) parsing said input signal waveforms into a sequence of time periods, wherein each time period has at least one signal transition on at least one of said input signals and has an end defined by said input signals all being stable for a period of time equal to MIDD;

(F) identifying a set of said logic circuit's nodes as watched nodes;

(G) for each said time period, initially simulating operation of said logic circuit without determining when signal transitions on said circuit's nodes occur, said initial simulation step including representing {assigning} each signal on each node in said logic circuit as having a value selected from the set consisting of stable signal values (0, 1, x and z) and non-stable signal values, said non-stable signal values including signal values (t0, t1, tx, tz) having a single transition during said time period, and a multiple transition signal value (mt) indicating more than one transition during said time period; said initial simulation step including evaluating outputs of said logic circuit's components using predefined extended boolean truth tables wherein for each of at least a plurality of said predefined extended boolean truth tables, said each predefined extended logic table specifies at least stable output, having one of said stable signal values, corresponding to a set of input signals that include at least one input signal having one of said non-stable signal values and at least one input signal having one of said stable signal values; and (H) for each said time period, (H1) determining which of said watched nodes were assigned a non-stable signal value by said initial simulation step, (H2) backtracking through said logic circuit for each respective watched node to identify which signal transitions on other nodes of said logic circuit control the timing of signal transitions on said respective watched node, and (H3) performing event driven simulation of said watched nodes assigned a non-stable signal value and said signal transitions on said other nodes identified by step H2 to determine time values for said identified signal transitions;

said steps G and H generating simulated waveforms representing signal values on said watched nodes over a defined period of time.

6. The circuit simulation method of claim 5, said steps (A-F) further including levelizing said logic circuit, and identifying all feedback loop nodes, if any, in said logic circuit;

said initial simulation step including evaluating each feedback loop node in accordance with predefined criteria to identify those of said feedback loop nodes whose signal value during a specified time period may be changed by propagation of signals through a feedback loop, and assigning said identified feedback loop nodes said multiple transition signal value for said specified time period;

said performing event driven simulation step including simulation of signal transitions on said feedback loop nodes and signal transitions on other nodes caused thereby.

7. The circuit simulation method of claim 5, said steps (A-F) further including levelizing said logic circuit, and identifying all feedback loop nodes, if any, in said logic circuit;

said initial simulation step including, when said logic circuit includes at least one identified feedback loop node, performing, for each said time period, a first evaluation of signal values on said logic circuit's nodes in which component input ports coupled to respective ones of said feedback loop nodes are assigned an initial signal value for said time period, to generate first commuted extended logic signal values for said logic circuit's nodes;

performing, for each said time period, a second evaluation of said signal values on said logic circuit's nodes in which component input ports coupled to respective ones of said feedback loop nodes are assigned said said first commuted extended logic signal values for said feedback loop nodes, to Generate second computed extended logic signal values for said logic circuit's nodes; and for each said time period, assigning said multiple transition signal value to any node of said logic circuit whose second commuted extended logic signal value assigned by said second evaluation differs from the first commuter extended logic signal value assigned during said first evaluation; and said performing event driven simulation step including simulation of signal transitions on said feedback loop nodes and signal transitions on other nodes caused thereby;

whereby signal transitions on any of said watched nodes in said logic circuit that result from signal transitions on said feedback loop nodes are properly simulated.

8. The circuit simulation method of claim 5, further including:

partitioning said logic circuit into a plurality of circuit partitions in accordance with predefined criteria;

for each respective circuit partition, separately performing step E for those of said input signals utilized by said each respective circuit partition, wherein said sequence time periods for each respective circuit partition may be different from said sequence of time periods for other ones of said circuit partitions; and repeatedly performing the steps of: selecting a circuit partition to simulate for one time period, and performing said steps G and H on said selected circuit partition for a next one of the selected circuit partition's sequence of time periods.

9. A logic circuit simulator for simulating operation of an electronic logic circuit having a multiplicity of logic gates, comprising:

(A) a computer memory for storing a netlist denoting said logic circuit's components and nodes interconnecting said components; each said component of said logic circuit having at least one input port and at least one output port, said nodes including circuit input nodes and circuit output nodes for said logic circuit;

(B) a cell library that stores cell delay data representing signal delays associated with said components in said logic circuit; said delay data for each component representing signal delays from each input port to each output port of said component;

(C) said computer memory further storing input signal waveforms for input signals applied to said circuit input nodes;

(D) input circuit parsing means for parsing said input signal waveforms into a sequence of variable length time periods in accordance with predefined criteria;

(E) said computer memory further storing a watched node identifying a set of said logic circuit's nodes as watched nodes;

(F) extended zero delay simulation means for simulating, for each said time period, operation of said logic circuit without determining when signal transitions on said circuit's nodes occur, said extended zero delay simulation means assigning each signal on each node in said logic circuit an extended boolean value selected from the set consisting of stable signal values (0, 1, x and z), and non-stable signal values, said non-stable signal values including signal values (t0, t1, tx, tz) having a single transition during said time period, and a multiple transition signal value (mt) indicating more than one transition during said time period; said extended zero delay simulation means evaluating outputs of said logic circuit's components using predefined extended boolean truth tables wherein for each of at least a plurality of said predefined extended boolean truth tables, said each predefined extended logic table specifies at least stable output, having one of said stable signal values, corresponding to a set of input signals that include at least one input signal having one of said non-stable signal values and at least one input signal having one of said stable signal values; and (G) dynamic demand simulation means that, for each said time period, backtracks through said logic circuit for each respective watched node assigned a non-stable value so as to identify nodes that control said respective watched node and that were assigned non-stable signal values, and then performs event driven simulation of said logic circuit for signal transition events on said identified nodes;

said extended zero delay simulation means and dynamic demand simulation means generating simulated waveforms representing signal values on said watched nodes over a defined period of time.

10. The logic circuit simulator of claim 9, further including a netlist analyzer for levelizing said logic circuit, and for identifying all feedback loop nodes, if any, in said logic circuit;

said extended zero delay simulation means including means for evaluating each feedback loop node in accordance with predefined criteria to identify those of said feedback loop nodes whose signal value during a specified time period may be changed by propagation of signals through a feedback loop, and for assigning said identified feedback loop nodes said multiple transition signal value for said specified time period;

said dynamic demand simulation means including means for simulating signal transitions on said feedback loop nodes and signal transitions on other nodes caused thereby.

11. The logic circuit simulator of claim 9, further including a netlist analyzer for levelizing said logic circuit, and identifying all feedback loop nodes, if any, in said logic circuit;

said extended zero delay simulation means including means, enabled when said logic circuit includes at least one identified feedback loop node, for performing for each said time period a first evaluation of signal values on said logic circuit's nodes in which component input ports coupled to respective ones of said feedback loop nodes are assigned initial signal values for said time period, to generate first commuted extended logic signal values for said logic circuit's nodes;

performing for each said time period a second evaluation of said signal values on said logic circuit's nodes in which component input ports coupled to respective ones of said feedback loom nodes are assigned said first commuted extended logic signal values for said feedback loop nodes, to generate second commuted extended logic signal values for said logic circuit's nodes; and assigning for each said time period said multiple transition signal value to any node of said logic circuit whose second commuted extended logic signal value assigned by said second evaluation differs from the first commuter extended logic signal value assigned during said first evaluation; and said dynamic demand simulation means including means for simulating signal transitions on said feedback loop nodes and signal transitions on other nodes caused thereby;

whereby signal transitions on any of said watched nodes in said logic circuit that result from signal transitions on said feedback loop nodes are properly simulated.

12. The logic circuit simulator of claim 9, further including:

further including a netlist analyzer for partitioning said logic circuit into a plurality of circuit partitions in accordance with predefined criteria;

said input circuit parsing means including means for separately parsing, for each respective circuit partition, those of said input signals utilized by each respective circuit partition, wherein said sequence time periods for said each respective circuit partition may be different from said sequence of time periods for other ones of said circuit partitions; and said extended zero delay simulation means and dynamic demand simulation means further including partition selection means for repeatedly selecting a circuit partition to simulate for one time period, and then simulating said selected circuit partition for a next one of the selected circuit partition's sequence of time periods.

* * * * *